US011721952B2

(12) United States Patent
Kalifa et al.

(10) Patent No.: US 11,721,952 B2
(45) Date of Patent: Aug. 8, 2023

(54) VERTICAL-CAVITY SURFACE-EMITTING LASER (VCSEL) DEVICE AND METHOD OF MAKING THE SAME

(71) Applicant: Mellanox Technologies, Ltd., Yokneam (IL)

(72) Inventors: Itshak Kalifa, Bat Yam (IL); Elad Mentovich, Tel Aviv (IL); Vladimir Iakovlev, Ecublens (CH); Yuri Berk, Kiryat Tivon (IL); Tamir Sharkaz, Kfar Tavor (IL)

(73) Assignee: Mellanox Technologies, Ltd., Yokneam (IL)

( * ) Notice: Subject to any disclaimer, the term of this patent is extended or adjusted under 35 U.S.C. 154(b) by 0 days.

(21) Appl. No.: 16/828,764

(22) Filed: Mar. 24, 2020

(65) Prior Publication Data

US 2021/0305783 A1    Sep. 30, 2021

(51) Int. Cl.
*H01S 5/183* (2006.01)
*H01S 5/343* (2006.01)
(Continued)

(52) U.S. Cl.
CPC .......... *H01S 5/18322* (2013.01); *H01S 5/021* (2013.01); *H01S 5/0217* (2013.01); *H01S 5/0218* (2013.01); *H01S 5/02461* (2013.01); *H01S 5/1838* (2013.01); *H01S 5/18311* (2013.01); *H01S 5/18358* (2013.01); *H01S 5/18363* (2013.01); *H01S 5/3095* (2013.01);
(Continued)

(58) Field of Classification Search
CPC ... H01S 5/18363–18366; H01S 5/3095; H01S 5/18311–18313; H01S 5/1838
See application file for complete search history.

(56) References Cited

U.S. PATENT DOCUMENTS

| 9,966,733 B2 | 5/2018 | Feng et al. |
| 10,396,527 B2 | 8/2019 | Sirbu et al. |

(Continued)

OTHER PUBLICATIONS

Feng, Milton et al., "Oxide-Confined VCSELs for High-Speed Optical Interconnects", IEEE Journal of Quantum Electronics vol. 54, Issue: (Jun. 3, 2018).

(Continued)

*Primary Examiner* — Sean P Hagan
(74) *Attorney, Agent, or Firm* — Moore & Van Allen PLLC; Anup Shrinivasan Iyer

(57) ABSTRACT

A VCSEL includes an active region between a top distributed Bragg reflector (DBR) and a bottom DBR each having alternating GaAs and AlGaAs layers. The active region includes quantum wells (QW) confined between top and bottom GaAs-containing current-spreading layers (CSL), an aperture layer having an optical aperture and a tunnel junction layer above the QW. A GaAs intermediate layer configured to have an open top air gap is disposed over a boundary layer of the active region and the top DBR. The air gap is made wider than the optical aperture and has a height equal to one quarter of VCSEL's emission wavelength in air. The top DBR is attached to the intermediate layer by applying wafer bonding techniques. VCSEL output, the air gap, and the optical aperture are aligned on the same optical axis. The bottom DBR is epitaxially grown on a silicon or a GaAs substrate.

17 Claims, 3 Drawing Sheets

(51) Int. Cl.
*H01S 5/02* (2006.01)
*H01S 5/30* (2006.01)
*H01S 5/024* (2006.01)
*H01S 5/042* (2006.01)

(52) U.S. Cl.
CPC ...... *H01S 5/34306* (2013.01); *H01S 5/34353* (2013.01); *H01S 5/04257* (2019.08)

(56) References Cited

U.S. PATENT DOCUMENTS

| | | | |
|---|---|---|---|
| 10,601,201 | B1 | 3/2020 | Sirbu et al. |
| 2002/0131458 | A1* | 9/2002 | Sirbu ............... B82Y 20/00 372/20 |
| 2003/0107034 | A1* | 6/2003 | Viktorovitch ........ G02B 26/001 257/37 |
| 2004/0264530 | A1* | 12/2004 | Ryou ................. H01S 5/04254 372/44.01 |
| 2006/0050755 | A1* | 3/2006 | Suzuki ............... H01S 5/423 372/50.121 |
| 2006/0227835 | A1* | 10/2006 | Ueki .................. H01S 5/18341 372/50.124 |
| 2008/0151959 | A1* | 6/2008 | Nakagawa ........... H01S 5/1833 372/50.11 |
| 2008/0212633 | A1* | 9/2008 | Shimizu ............... B82Y 20/00 372/45.011 |
| 2016/0079736 | A1* | 3/2016 | Yvind ................ G01B 9/02002 156/60 |
| 2017/0093128 | A1* | 3/2017 | Fattal .................. H01S 5/18386 |
| 2018/0011248 | A1 | 1/2018 | Bourstein et al. |

OTHER PUBLICATIONS

Sarmiento, Tomas et al., "Continuous-Wave Operation of GaAs-based 1.5 um GaInNAsSb VCSELs", IEEE Phot. Tech. Lett, vol. 31, N8, (Aug. 2019).

Sirbu, Alexei et al., "Wafer-fused heterostructures: application to vertical cavity surface-emitting lasers emitting in the 1310 nm band", Semicond. Sci. Technol,26, 014016 (2011).

Sirbu, Alexei et al., "Reliability of 1310 nm Wafer Fused VCSELs", IEEE Photonics Technology Letters, vol. 25, (16), pp. 1555-1558, (2013).

Ayar Labs; Solution Brief; Paradigm Change: Reinventing HPC Architecture with In-Package Optical I/O; dated Jul. 20, 2020; downloaded from: https://insidehpc.com/2020/07/paradigm-change-reinventing-hpc-architectures-with-in-package-optical-i-o/; 9 pages.

Bollani, M. et al.; "Selective Area Epitaxy of GaAs/Ge/Si Nanomembranes: A Morphological Study", Crystals 2020, 10(2), 57; https://doi.org/10.3390/cryst10020057; 9 pages.

Cooke, Mike; Semiconductor TODAY Compounds & Advanced Silicon, vol. 9, Issue 10, Dec. 2014/Jan. 2015, http://dx.doi.org/10.7567/.

Ferrara, J. et al.; "Heterogeneously Integrated Long-Wavelength VCSEL using High-Contrast Grating on Silicon", CLEO:2014 © 2014 OSA; 2 pages.

Fukushima, T. et al.; "New Three-Dimensional Integration Technology Using Chip-to-Wafer Bonding to Achieve Ultimate Super-Chip Integration"; Japanese Journal of Applied Physics, vol. 45, Part 1, No. 4B, 2006; pp. 3030-3035.

Huffaker, D. L. et al.; "Sealing AlAs Against Oxidative Decomposition and its Use in Device Fabrication," in CLEO'96, Anaheim, No. JTuH5; pp. 206-207.

Moser, P. et al.; "81 fJ/bit energy-to-data ratio of 850 nm vertical-cavity surface-emitting lasers for optical interconnects," Applied Physics Letters, vol. 98, No. 23, pp. 231106-231106-3, 2011.

Muller, M.; et al.; "1550-nm High-Speed Short-Cavity VCSELs," IEEE Journal of Selected Topics in Quantum Electronics, vol. 17, No. 5, pp. 1158-1166, 2011.

Ohno, Y. et al.; "Chemical bonding at room temperature via surface activation to fabricate low-resistance GaAs/Si heterointerfaces", Applied Surface Science, vol. 525, Sep. 30, 2020, 146610; 5 pages.

Park, M. et al., "Hetero-integration Enables Fast Switching Time-Of-Flight Sensor for Light Detection and Ranging"; Scientific Reports; NatureResearch; 2020; 10:2764; pp. 1-8.

Persano, A. et al.; "Thin Film Encapsulation for RF MEMS in 5G and Modern Telecommunication Systems", Sensors (Basel). Apr. 2020; 20(7): 2133, 10.3390/s20072133; 12 pages.

Qiao, P. et al.; "Wavelength-Swept VCSELs"; IEEE Journal of Selected Topics in Quantum Electronics, vol. 23, No. 6, Nov./Dec. 2017; 16 pages; DOI: 10.1109/JSTQE.2017.2707181.

Suzuki, J. et al.; "Introduction of AlInAs-oxide current-confinement structure into GaInAsP/SOI hybrid Fabry-Pérot laser", Japanese Journal of Applied Physics 56, 062103 (2017).

\* cited by examiner

VERTICAL-CAVITY SURFACE-EMITTING LASER (VCSEL) DEVICE AND METHOD OF MAKING THE SAME

FIELD

Embodiments described herein relate to lasers for fiber-optical data transmission, and more particularly, for VCSEL design and manufacturing.

BACKGROUND

The use of vertical-cavity surface-emitting lasers (VCSELs) for optical transmission in fiber optic systems has provided several advantages over commonly used edge-emitting lasers. For example, VCSELs require less power consumption and can be manufactured more efficiently than edge-emitting lasers. One aspect of this efficiency is provided by the on-wafer testing capability of VCSELs. The on-wafer testing results in a considerable cost advantage compared with conventional testing techniques used for edge emitting lasers. Furthermore, VCSELs provide reliable operation over time, which is essential for applications in fiber optic systems.

To meet the continuously growing demands for increased bandwidth in telecommunication networks, from growing data traffic in big data centers as well as in local and access networks, there is a need for optimized and high-speed VCSELs with GaInNAsSb/GaAs—based active regions that can be applied in optical links that transmit over long distances (e.g., more than 2 kilometers), which is not possible with standard VCSELs comprising gallium arsenide (GaAs) based active regions.

Therefore, there is a need to find a VCSEL design with less challenging fabrication process for higher fabrication yield and low cost.

BRIEF SUMMARY

Embodiments of a vertical-cavity surface-emitting laser (VCSEL) are disclosed. The embodiments of disclosed VCSEL may comprise the following elements: a first substrate and a first reflector disposed on the first substrate, and a second reflector on a temporary substrate. There is an active region structure disposed between the first reflector and the second reflector. The active region structure comprises: a quantum well structure; a plurality of current spreading layers; an oxide layer disposed above the quantum well structure, and the oxide layer comprises an optical aperture for the laser light emitted by the VCSEL; and a tunnel junction layer disposed between the oxide layer and the second reflector. The active region structure generates a photonic standing wave. There is an air gap formed in an intermediate layer above the active region structure, wherein the intermediate layer comprises a first surface facing the active region structure and a second surface attached to the second reflector. In addition, an N-type of electric contact layer is patterned adjacent to the active region structure and a P-type of electric contact layer is patterned on a top surface of the second reflector. The air gap, the optical aperture in the oxide layer, and the VSCEL laser output align on one optical axis.

In some cases, the VCSEL is configured to emit a laser light within a wavelength range from 1200 nanometers (nm) to 1900 nm.

In some cases, the first reflector comprises a distributed Bragg reflector (DBR) stack including an even number of alternating semiconductor layers, and the second reflector comprises a DBR stack including an odd number of alternating semiconductor layers.

In some cases, the first reflector and the second reflector each comprises un-doped alternating layers of aluminum gallium arsenide (AlGaAs) and gallium arsenide (GaAs).

In some cases, the second reflector comprises doped alternating layers of AlGaAs and GaAs, and wherein the P-type of electric contact layer is formed on the top surface of the doped second reflector.

In some cases, the air gap has a height equal to one quarter of an emission wavelength of the VCSEL in air, and wherein a bottom of air gap is placed in an antinode of the photonic standing wave and a top side of the air gap is placed in a node of the photonic standing wave.

In some examples, the plurality of current spreading layers comprises a first current spreading layer and a second current spreading layer stacked under the quantum well structure, wherein both the first and the second current spreading layers contain n-type GaAs.

In some examples, the plurality of current spreading layers further comprises a third current spreading layer between the quantum well structure and the oxide layer, wherein the third current spreading layer contains n-type GaAs. The plurality of current spreading layers further comprises a fourth current spreading layer between the oxide layer and the tunnel junction layer, wherein the fourth current spreading layer contains p-type GaAs.

In some cases, the plurality of current spreading layers further comprises a fifth current spreading layer between the tunnel junction layer and the intermediate layer, wherein the fifth current spreading layer contains n-type GaAs.

In some cases, a boundary layer is disposed directly on the fifth current spreading layer, wherein the boundary layer contains AlGaAs and has etch selectivity over GaAs.

In some cases, the intermediate layer comprises eutectic layers for bonding with the second reflector at low temperatures.

In another case, the air gap further comprises materials to increase heat dissipation, wherein said materials include graphene, carbon nanotubes (CNT), or diamond.

In some cases, the air gap is wider than the optical aperture.

In some cases, wherein the tunnel junction comprises a heavily doped p++/n++ tunnel junction.

In some cases, the first substrate and the second substrate each is a GaAs wafer.

In some cases, the first substrate is a silicon wafer.

In some examples, the method further comprising adjusting a height of the opening in the sixth current spreading layer, for example, to be equal to one quarter of an emission wavelength of the VCSEL in air.

In some examples, attaching the top surface of the sixth current spreading layer directly to the second reflector comprises applying a wafer bonding technique.

Embodiments of the present invention also provide methods for making a vertical-cavity surface-emitting laser (VCSEL). For example, the method of fabricating a VCSEL includes, first provide a first substrate and dispose a first reflector on the first substrate, and provide a second substrate and disposing a second reflector on the second substrate. Between the first reflector and the second reflector an active region structure is formed for generating photonic standing waves. For example, the active region may include a quantum well structure, a plurality of current-spreading layers, a tunnel junction layer and an oxide layer between the quantum well structure and the tunnel junction layer. The oxide layer is configured to have an optical and electrical aperture. The method also includes disposing an intermediate layer between the active region structure and the second reflector and forming an opening through the intermediate layer. In this example the opening is configured to have a width larger than a width of the optical aperture. Then, the method further includes attaching the intermediate layer directly to a bottom surface of the second reflector, followed by removing the second substrate from the second reflector. To complete the process, an N-type electric contact layer is formed adjacent to the active region structure and a P-type electric contact layer is formed on a top surface of the second reflector. At the end, a laser output feature of the VCSEL is formed on the top surface of the second reflector. The opening through the intermediate layer, the optical aperture, and the laser output align on one optical axis.

In some examples, the plurality of current spreading layers comprises: a first current spreading layer and a second current spreading layer stacked under the quantum well structure, wherein both the first and the second current spreading layers contain n-type GaAs; a third current spreading layer disposed between the quantum well structure and the oxide layer, wherein the third current spreading layer contains n-type GaAs; a fourth current spreading layer disposed between the oxide layer and the tunnel junction layer, wherein the fourth current spreading layer contains p-type GaAs; and a fifth current spreading layer disposed between the tunnel junction layer and the intermediate layer, wherein the fifth current spreading layer contains n-type GaAs.

In some cases, a boundary layer is disposed directly on the fifth current spreading layer, wherein the boundary layer contains AlGaAs and has etch selectivity over GaAs.

In some other cases, the first reflector and the second reflector each comprises un-doped alternating layers of aluminum gallium arsenide (AlGaAs) and gallium arsenide (GaAs), and wherein the intermediate layer comprises GaAs.

In some cases, the method further includes adjusting a height of the opening in the intermediate layer to be equal to one quarter of an emission wavelength of the VCSEL in air and placing a bottom side of the opening in an antinode of the photonic standing wave and a top side of the air gap in a node of the photonic standing wave at top.

In some cases, the method further includes attaching the second surface of the intermediate layer directly to the second reflector comprises applying a wafer bonding technique.

BRIEF DESCRIPTION OF THE DRAWINGS

Having thus described the invention in general terms, reference will now be made to the accompanying drawings, which are not necessarily drawn to scale.

Figure 1:
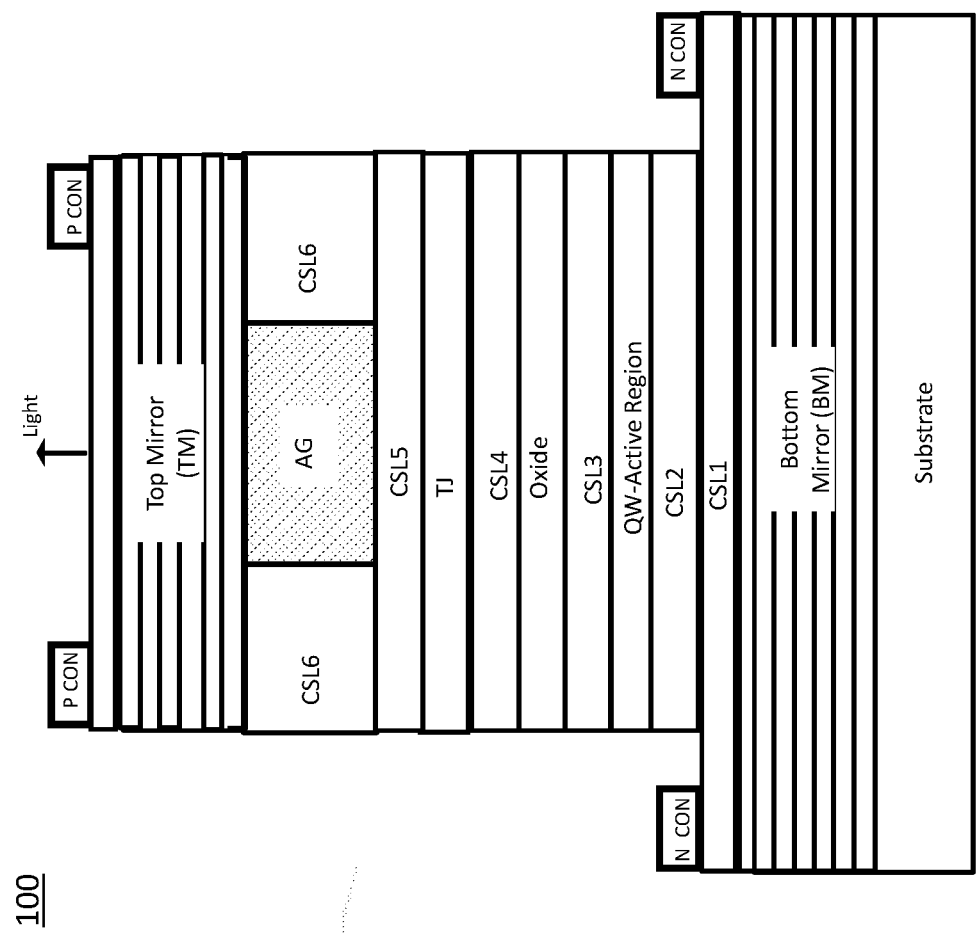
Figure 2:
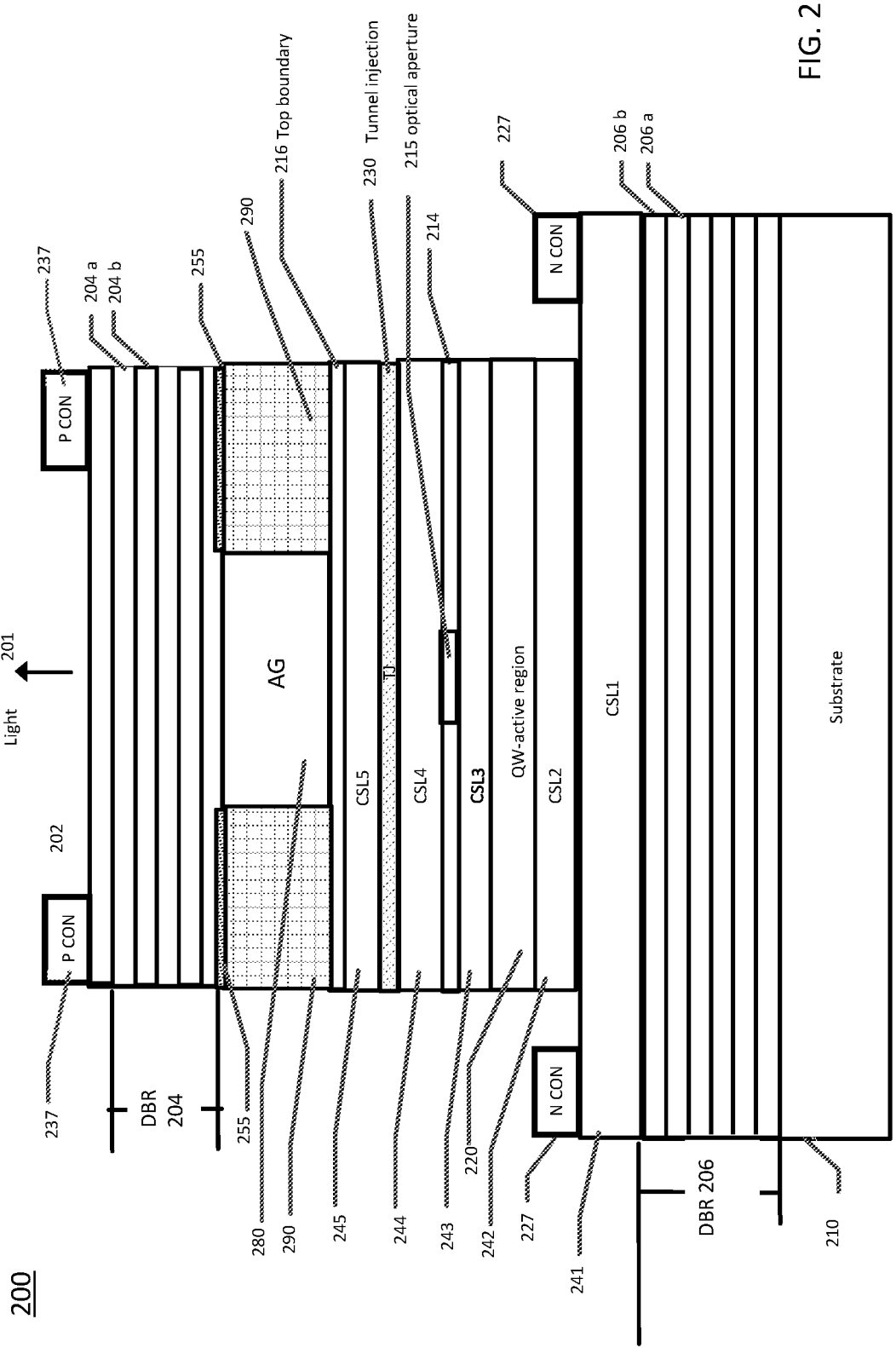
Figure 3:
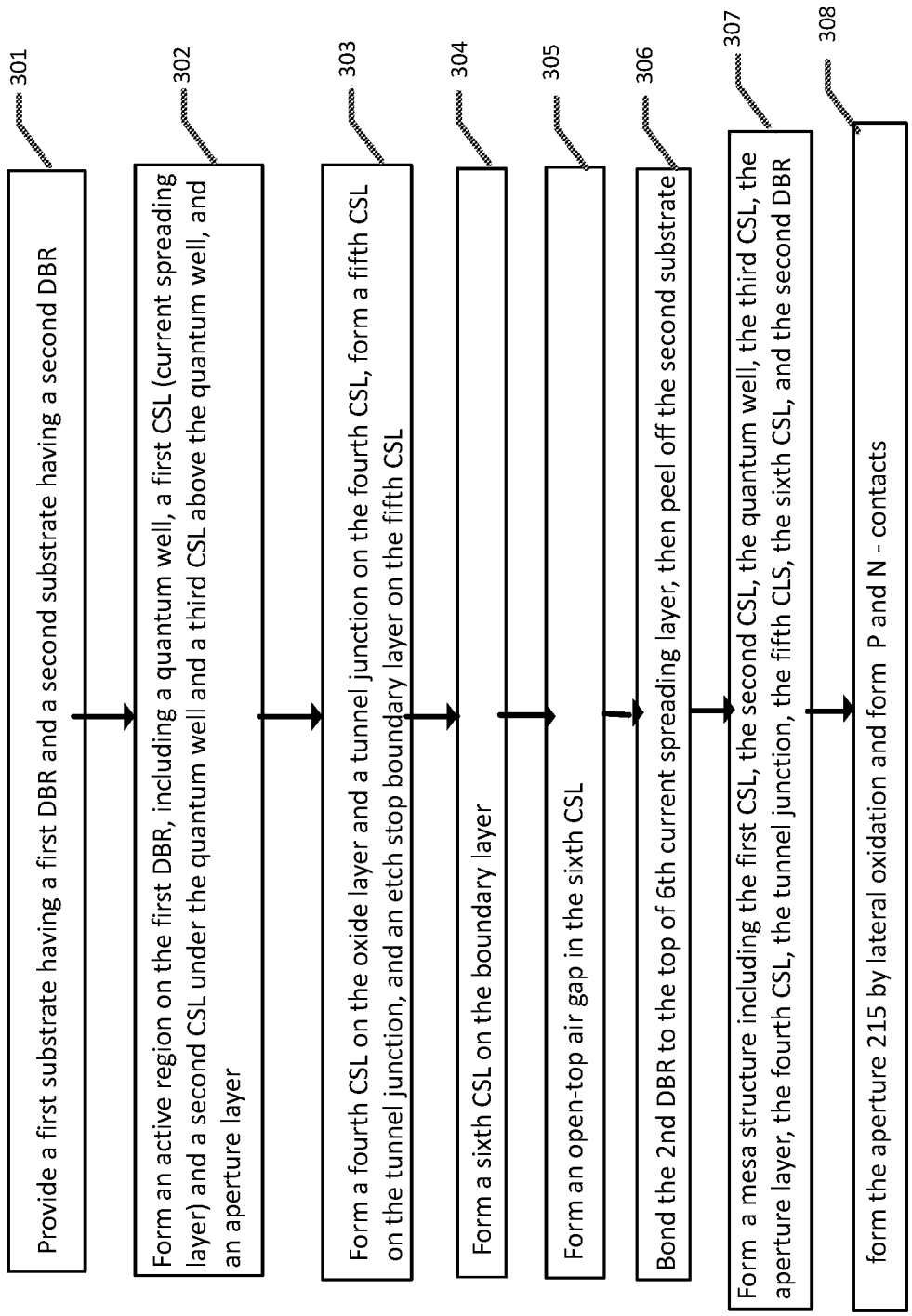

FIG. 1 shows a schematic cross-sectional diagram of a design of a vertical-cavity surface-emitting laser (VCSEL), according to the present disclosure;

FIG. 2 illustrates a schematic cross-sectional view of the components of the VCSEL, according to an exemplary embodiment of the present disclosure; and FIG. 3 is a flowchart illustrating an exemplary method for manufacturing a VCSEL according to other embodiments of the present disclosure.

DETAILED DESCRIPTION OF THE INVENTION

The present invention now will be described more fully hereinafter with reference to the accompanying drawings, in which some, but not all embodiments of the invention are shown. Indeed, the invention may be embodied in many different forms and should not be construed as limited to the embodiments set forth herein; rather, these embodiments are provided so that this disclosure will satisfy applicable legal requirements. Like numbers refer to like elements throughout.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known processes and manufacturing techniques have not been described in particular detail in order to avoid unnecessarily obscuring the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the features, structures, configurations, or characteristics may be combined in any suitable manner in one or more embodiments.

The terms "over," "spanning," "to," "between," and "on" as used herein may refer to a relative position of one layer with respect to other layers. One layer "over," "spanning," or "on" another layer or bonded "to" or in "contact" with another layer may be directly in contact with the other layer or may have one or more intervening layers. One layer "between" layers may be directly in contact with the layers or may have one or more intervening layers.

VCSELs demonstrate good performance in continuous wave (CW) and high-speed data transmission, as well as reliable operations important for applications in fiber-optics communication systems. VCSELs can be deployed and remain in operation for long periods of time, which is important when constructing a fiber optic network that may face many different environments and stress conditions. Most of today's VCSELs for short wavelengths are made without using a wafer-fusing process, because a single epitaxially grown wafer is used in making the VCSELs. Wafer-fused VCSELs have generally demonstrated both electrical and mechanical durability.

However, still to this day, VCSELs emitting in long wavelength bands (1200-1650 nm) are less mature than those of short wavelength counterparts based on wafers grown in a single epitaxial run.

Although there have been some designs and fabrication approaches of long wavelength VCSELs with good continuous wave (cw) and modulation performance as well as reliable operation, those VCSEL fabrication processes are based on a wafer fusion process in which an InP-based active cavity is combined with AlGaAs/GaAs Distributed Bragg Reflectors (DBRs) through a fusing procedure. These technologies are much more complicated as compared with standard short wavelength VCSEL technology. In particular, due to the large thermal expansion coefficient mismatch between InP and GaAs substrate, parameter control of bonded structures is not meeting the requirements of mass production on large wafers. The main challenge in wafer fusing of InP to GaAs structure is the dimension change of patterned structure on InP after bonding to GaAs. For example, a given dimension $d_b$ of the patterned epitaxial structure on an InP wafer before bonding is translated into a new dimension $d_b$ on a GaAs wafer after bonding. In the best bonding process, $d_a=(1-s/10000) d_b$, where s is a scaling coefficient. In other words, there is a dimension shrink of s μm per cm. Although the theoretically calculated value of this coefficient s is ~7, the experimental data shows it in the range of from 5 to 15. As one can easily see, with this big uncertainty in the experimental value of scaling coefficient s, the reproducibility and yield can be problematic in mass production.

VCSELs in a long wavelength band (1200-1650 nm) fabricated by using wafer-fusion for combining InP-based active cavity with AlGaAs/GaAs distributed Bragg reflectors (DBRs) have been demonstrated. This technology is much more complicated as compared with standard short wavelength VCSEL technology, in particular due to the large mismatch in thermal expansion coefficients between the InP layer and the AlGaAs/GaAs substrate.

The disclosed invention describes a generic design and process fabrication method for high performance VCSELs in general, and for long wavelength VCSELs in particular. The technique applies to growing GaAs epitaxial structures on GaAs substrates as well as to growing GaAs epitaxial structures on silicon substrates. In making the VCSELs of this design, one applies standard wafer processing steps for the oxide-confined VCSELs working at short wavelengths. The disclosed VCSELs for long wavelengths can be fabricated with long emission wavelengths then combined with the long wavelengths in Wavelength-Division-Multiplexing (WDM) selected by the greedy algorithm. This generic VCSEL design for emission is compatible with the coupling elements adapting from a VCSEL chip to a single or multicore fiber for applications in space and wavelength division multiplexing.

FIG. 1 shows a schematic cross-sectional view of a generic design of a vertical-cavity surface-emitting laser (VCSEL), according to embodiments of the present disclosure.

In FIG. 1, the VCSEL device 100 includes a bottom substrate, a bottom distributed Bragg reflector (DBR) or bottom mirror (BM) fabricated on the bottom substrate, and a top DBR or top mirror (TM) fabricated on the top substrate. An active region includes a quantum well (QW) stack sandwiched between a number of current spreading layers formed below the quantum well, and a stack of current spreading layers, an oxide layer, and a tunnel junction layer built above the quantum well structure. A top current spreading layer above the active region is configured to have an open-top air gap (AG) in the center. A top mirror is attached to the top current spreading layer.

In addition, there are P contacts (P CON) and N contacts (N CON) for exciting the hole and electron carriers, which then recombine to generate photons. This laser light emitted and passing out of the active region passes the air gap and exits from the top mirror. The VCSEL structure 100 shown in FIG. 1 is designed to emit laser light from its top, but it can be reconfigured to emit light from the bottom, as well.

A detailed design of the components of the new VCSEL is illustrated in FIG. 2, according to an example embodiment of the present disclosure.

The structure of the VCSEL 200 includes a quantum well (QW) active region 220 disposed between a top distributed Bragg reflector 204 and a bottom distributed Bragg reflector 206.

The top DBR reflector 204 or the bottom DBR reflector 206 comprises alternating layers, 204a/204b or 206a/206b, of aluminum gallium arsenide (AlGaAs) and gallium arsenide (GaAs)

In some examples, the second reflector may comprise doped alternating layers of AlGaAs and GaAs, and electric contacts may be formed on the doped second reflector.

The top reflector 204 and the bottom reflector 206 in the illustrated embodiment are both made of distributed Bragg reflectors (DBR). In the example design shown in FIG. 2, the laser output light 201 emits from the top. This structure can be configured to emit light from the bottom as well, in which case the DBR reflectors would be adjusted accordingly.

Referring to the embodiment of FIG. 2, the quantum well 220 is sandwiched between two sets of current spreading layers. The first set of current spreading layers is placed under the quantum well 220 and may include more than one current spreading layers. In the example of FIG. 2, the first current spreading layer 241 or CSL1 is disposed on the bottom DBR reflector 206 and the second current spreading layer 242 or CSL2 is stacked between the first current spreading layer CSL1 241 and the quantum well 220. The first and second current spreading layers 241 CSL1 and 242 CSL2 contain n-type GaAs. The quantum well 220 is disposed directly on the second current spreading layer 242 CSL2. The quantum well active region 220 includes a stack of quantum wells and quantum barriers. Another set of current spreading layers are placed above the quantum well 220. In the example of FIG. 2, there are four GaAs current spreading layers in the set. A n-type GaAs-containing current spreading layer 243 or CSL3 is formed between the quantum well active region 220 and an oxide layer 214. An optical aperture 215 is formed in the middle of the oxide layer 214 to confine current as well as to let out photons generated by carrier recombination in the quantum well region 220. A p-type GaAs fourth current spreading layer 244 or CSL4 is disposed on top of the oxide layer. A tunnel junction layer 230 is deposited on the fourth current spreading layer 244 CSL4. The tunnel junction 230 injects holes to combine with electrons necessary for photon generation. In this example, the photon exit window is defined by the optical aperture 215. The fifth current spreading layer 245 or CSL5, is deposited on the tunnel junction layer 230. A sixth current spreading layer 290 or CSL6 is formed above the fifth current spreading layer CSL5. A typical material for CSL5 and CSL6 is GaAs. A top boundary layer 216 separating CSL5 and CSL6, often including AlGaAs, is provided for use as the etch stopping layer between the two GaAs layers for patterning the air gap hole 280 described below.

An open-top air gap 280 is formed through the sixth current spreading layer 290 or CSL6. This sixth current spreading layer CSL6 is sometimes referred to as an intermediate layer 290. The air gap 280 is aligned above the optical aperture 215 along a vertical optical axis of the VCSEL. The air gap 280 is usually made wider than the optical aperture.

Etching the air gap 280 through the GaAs-containing sixth current spreading layer 290 should stop at the top boundary layer 216 of the CSL5, because the boundary layer 216 contains AlGaAs and the etching is selective between the two materials GaAs and AlGaAs. The remaining sixth current spreading layer 290 outside the gap forms a structure encircling the air gap 280. The bottom side of the air gap 280 is placed on the boundary layer 216 and is in an antinode of the photonic standing wave, and the top side of the air gap 280 is placed under the second DBR 204 and is in the node of the photonic standing waves.

The VCSEL emission wavelength is a variable of a set of parameters of the air gap 280. For example, the vertical distance or height within the air gap 280 is configured equal to one quarter of the chosen emission wavelength in the air such that the emission wavelength is accurately adjusted by designing and fabricating the air gap 280 to the necessary height by different processing approaches. The optical aperture 215 defines the vertical optical axis for amplified light to emit as 201 at the top of the VCSEL.

According to the embodiment as shown in FIG. 2, the top DBR mirror 204 is formed on a GaAs substrate first in a separate process, the layer 290 is attached intimately at an interface layer 255 only to the edges of the top DBR mirror 204 using a wafer bonding technique. Not only does the GaAs-to-GaAs wafer bonding not cause material difference scaling problems, but by performing low temperature bonding no thermal expansion coefficient mismatch appears at the interface layer 255. In addition, there is no interface fusing layer in the optical axis above the through-hole air gap 280, such that optical losses in the region of the air gap 280 are eliminated and low electrical resistance at this fused interface 255 is achieved.

After the wafer bonding process, the top DBR mirror 204 is secured over the VCSEL cavity. The second substrate supporting the top DBR mirror 204 is peeled off from the mirror 204. A layer of p-type contacts 237 is patterned on the top DBR mirror 204. Thus, the N-type contact 227 and P-type contact 237 are symmetrically arranged and interchangeable in their positions close to and above the quantum well region 220 to provide excitation energy to the quantum well materials in the QW active region 220. Carriers are accelerated under the electric field from N-CON 227 and P-CON 237 as they travel inside the active region.

As described above, the GaAs to GaAs bonding technique in this described embodiment presents a significant advance over the case of GaAs to n-InP fusing in a conventional bonding.

In another embodiment, VCSEL structure 200 may be formed on a bottom substrate 210, which is a silicon substrate such as a silicon wafer. Epitaxial growth of the bottom DBR reflector 206, active region stacks, and the air gap layer, up to the interface 255, will be performed on a silicon wafer.

Simulations have indicated that the amount of the optical energy in the top DBR 204 reflector is drastically lower than the amount in the bottom DBR 206 in a top emitting VCSEL device. This result enables a further decrease in the optical losses in the top DBR 204. As depicted in the cross-sectional view of the VCSEL in FIG. 2, p-type electric contact 237 is designed to be on the top surface of the DBR reflector 204 around the light emitting aperture, so the top DBR mirror 204 can be doped thus making possible the fabrication of p-contact on top DBR.

In addition, the embodiment in FIG. 2 allows the confinement factor (CF) to be increased as compared with that of the state-of-the-art design. This is important for increasing device performance, as it serves to decrease threshold current and operation current and increase speed performance.

In another embodiment, appropriate eutectic layers such as Au—Si and Al—Si are fabricated in the layer 290, in order to further mitigate thermal mismatch at a high temperature. The most versatile combination of the eutectic layers can be selected for easing the fused interface thermal stress.

According to another embodiment, one can insert into the air gap 280 special materials to increase device performance. For example, adding materials such as carbon nano-tubes (CNT), graphene or diamond in air gaps can increase heat dissipation, that will decrease the temperature of the active region at operating current, that in turn will increase the life time of the device.

The disclosed embodiment shown in FIG. 2 has an additional advantage—bonding patterned structures from two GaAs substrates enables easier scaling down of the geometrical parameters of VCSEL devices, because there is no need to increase the dimensions to accommodate uncertainty of scaling factor in InP to GaAs wafer bonding.

FIG. 3 is a flowchart illustrating an example method for manufacturing a VCSEL, according to the embodiments of the present disclosure.

Referring to FIG. 3, the manufacturing method of the VCSEL may include the following steps depicted in blocks 301 to 308. As shown in block 301, a first substrate 210 and a first distributed Bragg reflector (DBR) 206 on the first substrate 210 are provided. The first substrate can be a GaAs substrate, or a silicon substrate. The second substrate 212 supporting a second DBR reflector 204 is prepared for bonding later. Both first and second DBRs 204 and 206 include multiple alternating layers containing semiconductor materials, for example, gallium arsenide (GaAs) and aluminum gallium arsenide (AlGaAs). The top mirror or the second DBR 204, where the laser light outputs, has an odd number of layers. The bottom mirror or the first DBR 206 contains an even number of alternating layers or full periods of these layers. The DBR 206 and DBR 204 are fabricated on the substrates by epitaxially growing the multiple alternating semiconductor layers GaAs/AlGaAs.

As shown in block 302, the method further includes: forming an active region including a quantum well 220, a first current spreading layer 241 (CSL1) and a second current spreading layer 242 (CSL2) stacked up under the quantum well 220, a third current spreading layer 243 (CSL3) above the quantum well 220, and an aperture layer 214. The aperture is formed by a lateral oxidation process from the side.

As shown in block 303, the method of forming the active region also includes forming a fourth current spreading layer 244 (CSL4) on the layer 214 and of tunnel junction layers 230 on the fourth current spreading layer 244 (CSL4), forming a fifth current spreading layer 245 (CSL5) on the tunnel junction 230, and at then forming a top boundary layer 216 on the fifth current spreading layer 245 (CSL5), which consists of AlGaAs and will serve as an etch-stopping layer for selective etch protection for the underlying GaAs-containing CSL5.

As shown in block 304 and 305, the manufacturing method of the VCSEL further includes forming an open top air gap structure 280 through a GaAs-containing sixth current spreading layer 290 (CSL6), disposed above the top boundary layer 216 of the active region, wherein the air gap 280 is aligned to the optical aperture 215 along the optical axis of the VCSEL.

In block 305, the air gap 280 is formed so as to equal one quarter of the chosen emission wavelength in the air.

As shown in block 306, the second DBR reflector 204 is attached to the GaAs-containing sixth current spreading layer 290 by applying a wafer bonding technique. The interface layer 255 between the DBR reflector 204 and the GaAs layer CSL 6 does not overlap the airgap 280 where laser light travels along the optical axis so that the standing wave will not get distorted. The second substrate 212 is then peeled off from the second DBR 204. There is no thermal mismatch occurring as a result of this bonding process. The bonding stress, if any, stays on the edge of the second DBR 204.

A combination of eutectic metal layers can be added to the material outside the air gap to ease the bonding interface thermal stress when attaching to the top DBR. Those eutectic metals are alloys that transform directly from solid to liquid state, or vice versa. The eutectic temperature can be much lower than the melting temperature of the two or more pure elements forming the eutectic metal.

In block 307, a mesa structure is formed by etching the stack of layers including the first CSL 241, the second CSL 242, the quantum well 220, the third CSL 243, the aperture layer 214, the fourth CSL 144, the tunnel junction 230, the fifth CLS 245, the sixth CSL 290, and the second DBR 204.

Block 308 includes forming the optical aperture 215 by a lateral oxidation process through the center axis of the air gap 280, then completing the light emitting structure of the laser device VCSEL by making the N-contact 227 and the P-contact 237.

After the VCSEL structure 200 is fully fabricated as shown in FIG. 3, additional necessary VCSEL production and processing steps may be performed, including the formation of the passivation layers, as well as the formation of metal contact pads to complete the fabrication of the VCSEL device.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

In utilizing the various aspects of the embodiments, it would become apparent to one skilled in the art in light of this disclosure that combinations or variations of the above embodiments are possible for fabricating optical coupling structures. Although the embodiments have been described in language specific to structural features and/or methodological acts, it is to be understood that the appended claims are not necessarily to be limited to the specific features or acts described. The specific features and acts disclosed are instead to be understood as embodiments of the claims useful for illustration. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

Which is claimed is:

1. A vertical-cavity surface-emitting laser (VCSEL) comprising:
    a first substrate;
    a first reflector disposed on the first substrate;
    a second reflector formed on a gallium arsenide (GaAs) substrate;
    an active region structure disposed between the first reflector and the second reflector, wherein the active region structure comprises:
        a quantum well structure;
        a plurality of current spreading layers;
    an aperture layer disposed above the quantum well structure, wherein the aperture layer comprises an optical aperture for a laser light emitted by the VCSEL; and
    a tunnel junction layer disposed between the aperture layer and the second reflector;
    wherein the active region structure generates a photonic standing wave;
    an intermediate layer formed above the active region structure, wherein the intermediate layer comprises a first surface facing the active region structure and a second surface under the second reflector, wherein the intermediate layer contains GaAs, wherein the second surface of the intermediate layer is attached to the second reflector using a GaAs-to-GaAs wafer bonding technique to form a bonding interface;
    a eutectic layer disposed on the bonding interface using low temperature bonding to reduce thermal stress caused by the GaAs-to-GaAs wafer bonding;
    an air gap formed in the intermediate layer, wherein the air gap opens both the first surface and the second surface of the intermediate layer, and constitutes an optical path from the active region structure to the second reflector;
    an interfacial layer formed between a bottom surface of the second reflector and the second surface of the intermediate layer outside the air gap, wherein the interfacial layer does not overlap with the airgap, wherein the interfacial layer is attached to the second surface of the intermediate layer around the air gap;
    an N-type electric contact layer patterned adjacent to the active region structure and a P-side electric contact layer patterned on a top surface of the second reflector, connecting to a p-side of the active region structure; and
    a VCSEL laser output formed on the top surface of the second reflector;
    wherein the air gap, the optical aperture in the aperture layer, and the VSCEL laser output align on one optical axis.

2. The VCSEL of claim 1, wherein the VCSEL is configured to emit a laser light within a wavelength range from 1200 nanometers (nm) to 1900 nm.

3. The VCSEL of claim 1, wherein the first reflector comprises a distributed Bragg reflector (DBR) stack including an even number of alternating semiconductor layers, and wherein the second reflector comprises a DBR stack including an odd number of alternating semiconductor layers.

4. The VCSEL of claim 3, wherein each of the first reflector and the second reflector comprises un-doped alternating layers of aluminum gallium arsenide (AlGaAs) and gallium arsenide (GaAs).

5. The VCSEL of claim 3, wherein the second reflector comprises doped alternating layers of AlGaAs and GaAs, and wherein the P-type electric contact layer is formed on the top surface of the doped second reflector.

6. The VCSEL of claim 1, wherein the air gap has a height equal to one quarter of an emission wavelength of the VCSEL in air, and wherein a bottom side of the air gap is placed in an antinode of the photonic standing wave and a top side of the air gap is placed in a node of the photonic standing wave.

7. The VCSEL of claim 1, wherein the plurality of current spreading layers comprises a first current spreading layer and a second current spreading layer stacked under the quantum well structure, wherein both the first and the second current spreading layers contain n-type GaAs.

8. The VCSEL of claim 7, wherein the plurality of current spreading layers further comprises a third current spreading layer between the quantum well structure and the aperture layer, wherein the third current spreading layer contains n-type GaAs.

9. The VCSEL of claim 8, wherein the plurality of current spreading layers further comprises a fourth current spreading layer between the aperture layer and the tunnel junction layer, wherein the fourth current spreading layer contains p-type GaAs.

10. The VCSEL of claim 9, wherein the plurality of current spreading layers further comprises a fifth current spreading layer between the tunnel junction layer and the intermediate layer, wherein the fifth current spreading layer contains n-type GaAs.

11. The VCSEL of claim 10, wherein a boundary layer is disposed directly on the fifth current spreading layer, wherein the boundary layer contains AlGaAs and has etch selectivity over GaAs.

12. The VCSEL of claim 1, wherein the first substrate is a silicon wafer.

13. A method for fabricating a vertical-cavity surface-emitting laser (VCSEL) comprising:
    providing a first substrate;
    disposing a first reflector on the first substrate;
    providing a second substrate;
    disposing a second reflector on the second substrate;
    forming an active region structure for a photonic standing wave between the first reflector and the second reflector, wherein the active region comprises:
        a quantum well structure;
        a plurality of current-spreading layers;
        a tunnel junction layer;
        an aperture layer between the quantum well structure and the tunnel junction layer, wherein the aperture layer is configured to have an optical aperture;
    disposing an intermediate layer between the active region structure and the second reflector, wherein the intermediate layer comprises a first surface facing the active region structure and a second surface under the second reflector, wherein the intermediate layer contains GaAs, wherein the second surface of the intermediate layer is attached to the second reflector using a GaAs-to-GaAs wafer bonding technique to form a bonding interface;
    disposing a eutectic layer on the bonding interface using low temperature bonding to reduce thermal stress caused by the GaAs-to-GaAs wafer bonding;
    forming an air gap through the first surface and the second surface of the intermediate layer, wherein the air gap is configured to be above the optical aperture and has a width larger than a width of the optical aperture;
    attaching the intermediate layer directly to a bottom surface of the second reflector;
    forming an interfacial layer between the bottom surface of the second reflector and the second surface of the intermediate layer outside the air gap, wherein the interfacial layer does not overlap with the airgap, wherein the interfacial layer is attached to the second surface of the intermediate layer around the air gap;
    removing the second substrate from the second reflector;
    forming an N-type electric contact layer adjacent to the active region structure and a P-side electric contact layer on a top surface of the second reflector, connecting to a p-side of the active region structure; and
    forming a laser output of the VCSEL on the top surface of the second reflector, wherein the opening through the intermediate layer, the optical aperture, and the laser output align on one optical axis.

14. The method for fabricating the VCSEL of claim 13, wherein the plurality of current spreading layers comprises:
    a first current spreading layer and a second current spreading layer stacked under the quantum well structure, wherein both the first and the second current spreading layers contain n-type GaAs;
    a third current spreading layer disposed between the quantum well structure and the aperture layer, wherein the third current spreading layer contains n-type GaAs;
    a fourth current spreading layer disposed between the aperture layer and the tunnel junction layer, wherein the fourth current spreading layer contains p-type GaAs; and
    a fifth current spreading layer disposed between the tunnel junction layer and the intermediate layer, wherein the fifth current spreading layer contains n-type GaAs.

15. The method for fabricating the VCSEL of claim 13, further comprising a boundary layer disposed directly on the fifth current spreading layer, wherein the boundary layer contains AlGaAs and has etch selectivity over GaAs.

16. The method for fabricating the VCSEL of claim 13, wherein the first reflector and the second reflector each comprises un-doped alternating layers of aluminum gallium arsenide (AlGaAs) and gallium arsenide (GaAs), and wherein the intermediate layer comprises GaAs.

17. The method for fabricating the VCSEL of claim 13, further comprising adjusting a height of the opening in the intermediate layer to be equal to one quarter of an emission wavelength of the VCSEL in air and placing a bottom side of the opening in an antinode of the photonic standing wave and a top side of the air gap in a node of the photonic standing wave.

* * * * *